US008704081B2

(12) United States Patent
Banin et al.

(10) Patent No.: US 8,704,081 B2
(45) Date of Patent: Apr. 22, 2014

(54) LIGHT ENERGY CONVERSION SYSTEMS AND METHODS

(75) Inventors: Yoav Banin, Piedmont, CA (US); Gino D'Ovidio, L'Aquila (IT); Giovanni Lanzara, Rome (IT)

(73) Assignee: Solergy, Inc., Piedmont, CA (US)

( * ) Notice: Subject to any disclaimer, the term of this patent is extended or adjusted under 35 U.S.C. 154(b) by 999 days.

(21) Appl. No.: 12/113,788

(22) Filed: May 1, 2008

(65) Prior Publication Data

US 2008/0283116 A1    Nov. 20, 2008

(30) Foreign Application Priority Data

May 17, 2004    (IT) .............................. AQ2007A00009

(51) Int. Cl.
*H01L 31/058*   (2006.01)

(52) U.S. Cl.
USPC ........... 136/246; 136/248; 126/615; 126/657; 126/663; 126/685; 60/641.15

(58) Field of Classification Search
USPC .......... 136/248, 246; 126/615, 657, 663, 685; 60/641.15
See application file for complete search history.

(56) References Cited

U.S. PATENT DOCUMENTS

| | | | | |
|---|---|---|---|---|
| 4,002,031 A | * | 1/1977 | Bell | ............................ 60/641.15 |
| 4,080,221 A | | 3/1978 | Manelas | |
| 4,147,157 A | | 4/1979 | Zakhariya | |
| 4,149,903 A | | 4/1979 | Lindmayer | |
| 4,153,039 A | | 5/1979 | Carroll | |
| 4,155,346 A | * | 5/1979 | Aresty | ............................ 126/652 |
| 4,166,917 A | | 9/1979 | Dorfeld et al. | |
| 4,177,083 A | | 12/1979 | Kennedy | |
| 4,187,123 A | * | 2/1980 | Diggs | ............................ 136/206 |
| 4,217,887 A | * | 8/1980 | Hoffman et al. | .............. 126/664 |
| 4,248,643 A | | 2/1981 | Peters | |
| 4,249,516 A | | 2/1981 | Stark | |
| 4,307,709 A | | 12/1981 | Sletten et al. | |
| 4,326,012 A | | 4/1982 | Charlton | |
| 4,350,143 A | | 9/1982 | Laing et al. | |
| 4,388,481 A | | 6/1983 | Uroshevich | |
| 4,392,007 A | | 7/1983 | Barkats et al. | |
| 4,392,008 A | | 7/1983 | Cullis et al. | |
| 4,392,482 A | | 7/1983 | Chang | |

(Continued)

OTHER PUBLICATIONS

International Search Report and Written Opinion of the International Searching Authority for PCT Application PCT/US2008/063616, Filed May 14, 2008, 13 pgs.

*Primary Examiner* — Devina Pillay
(74) *Attorney, Agent, or Firm* — Jason P. Gross; The Small Patent Law Group LLC

(57) ABSTRACT

A light energy conversion (LEC) system includes a fluid circuit having a working fluid flowing therethrough and a plurality of light concentrating (LC) modules for converting light energy into electrical energy and for transforming the light energy into thermal energy. The LC modules including a first LC module coupled in series with a second LC module along the fluid circuit. The working fluid absorbs thermal energy while flowing through the first and second LC modules. At least the first LC module includes a light concentrating optical element that is configured to direct light energy toward a focal region and a receiver held at the focal region. The receiver includes a housing having a chamber that holds an energy conversion member. The energy conversion member transforms light energy received from the optical element into electrical and thermal energy.

27 Claims, 10 Drawing Sheets

(56) References Cited

U.S. PATENT DOCUMENTS

| | | |
|---|---|---|
| 4,397,303 A | 8/1983 | Stultz |
| 4,455,826 A | 6/1984 | Knoos |
| 4,473,065 A | 9/1984 | Bates |
| 4,520,794 A | 6/1985 | Stark et al. |
| 4,522,193 A | 6/1985 | Bates |
| 4,566,434 A | 1/1986 | Lindenbauer |
| 4,672,948 A | 6/1987 | Rosende |
| 4,768,345 A | 9/1988 | Kardas |
| 4,785,633 A | 11/1988 | Meijer et al. |
| 4,911,144 A | 3/1990 | Godett et al. |
| 4,943,325 A | 7/1990 | Levy |
| 5,153,780 A | 10/1992 | Jorgensen |
| 5,465,708 A | 11/1995 | Goebel et al. |
| 5,505,789 A | 4/1996 | Fraas et al. |
| 5,586,549 A | 12/1996 | Hartenstine et al. |
| 5,860,414 A | 1/1999 | Steinmann |
| 6,080,927 A | 6/2000 | Johnson |
| 6,384,320 B1 | 5/2002 | Chen |
| 6,434,942 B1 | 8/2002 | Charlton |
| 6,630,622 B2 | 10/2003 | Konold |
| 6,818,818 B2 | 11/2004 | Bareis |
| 6,841,891 B1 | 1/2005 | Luchinskiy et al. |
| 7,299,633 B2 | 11/2007 | Murphy et al. |
| 7,331,178 B2 | 2/2008 | Goldman |
| 2003/0075213 A1 | 4/2003 | Chen |
| 2003/0140960 A1 | 7/2003 | Baum et al. |
| 2005/0011513 A1 | 1/2005 | Johnson |
| 2005/0046977 A1* | 3/2005 | Shifman ............... 359/853 |
| 2005/0133082 A1 | 6/2005 | Konold et al. |
| 2006/0243319 A1 | 11/2006 | Kusek et al. |
| 2007/0157922 A1 | 7/2007 | Radhakrishnan et al. |
| 2007/0215198 A1 | 9/2007 | Jiang et al. |
| 2007/0227574 A1 | 10/2007 | Cart |
| 2007/0256724 A1 | 11/2007 | Fork et al. |
| 2007/0256725 A1 | 11/2007 | Fork et al. |

* cited by examiner

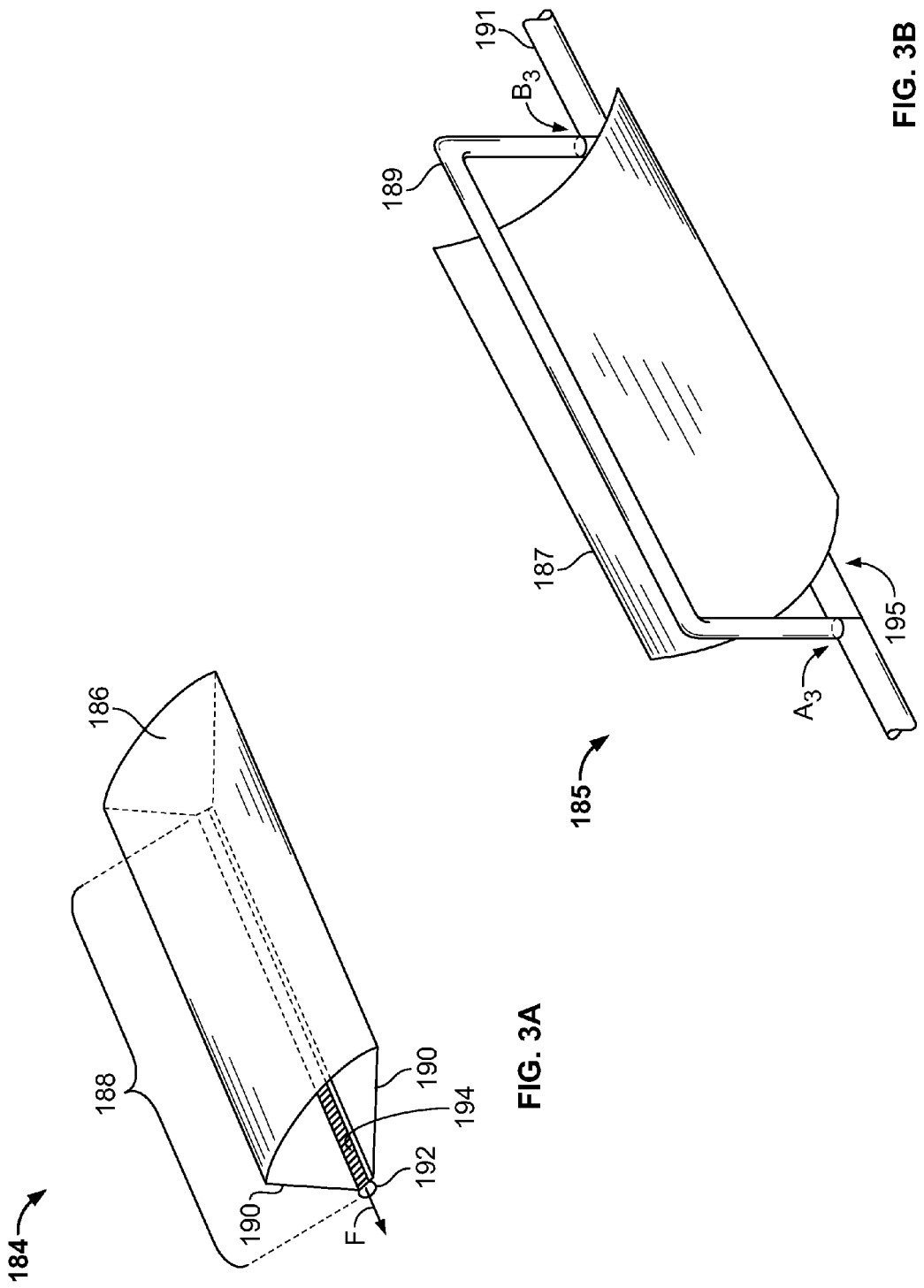

LIGHT ENERGY CONVERSION SYSTEMS AND METHODS

CROSS-REFERENCE TO RELATED APPLICATIONS

Pursuant to 35 U.S.C. §119, the present application claims priority to Italian Application No. AQ 2007000009, filed May 17, 2007, which is entitled "SISTEMA A CONCENTRAZIONE DI ENERGIA SOLARE PER USO FOTOVOLTAICO E/O TERMICO CON RECUPERO DI CALORE TRAMITE SCAMBIATORI A FLUIDO IN SERIE," Which is incorporated herein by reference in the entirety.

BACKGROUND OF THE INVENTION

The invention relates generally to light energy conversion systems, and more particularly to light energy conversion systems having light concentrating modules that transform light energy into electrical and/or thermal energy.

Light concentrating systems (e.g., solar concentrating collectors) exist today for generating electricity with a photovoltaic (PV) cell. Separate light concentrating systems exist today for capturing thermal energy through the transfer of heat into a working fluid. In both types of systems, a substantial portion of the available energy from the sun is not captured and therefore not put to use. For example, in the case of collectors that generate only electricity a substantial amount of thermal energy is dissipated into the surroundings. By capturing and applying this waste heat, it would be possible to increase the overall light energy conversion efficiency of the system increase the energy production per square meter of the installed system and enable applications such as hot water heating, space heating, industrial process heat, and air conditioning in addition to electricity generation.

At least some known co-generating systems exist that generate both electrical and thermal energy. However, there have been limited demonstrations of light concentrating systems that generate both electricity and thermal energy based on a plurality of light concentrating modules. Generally these systems are limited in both the quantity and quality of thermal energy that can be obtained. Furthermore, the fundamental challenge remains of keeping the PV cell cool while generating electrical energy and still extracting sufficient thermal energy at a broad enough range of temperatures to enable various applications.

Thus, there is a need for co-generating light energy conversion systems and methods that operate with sufficient PV conversion efficiencies, while also providing effective thermal energy capture and conservation.

BRIEF DESCRIPTION OF THE INVENTION

In one embodiment, a light energy conversion (LEC) system for generating electrical and thermal energy is provided. The system includes a fluid circuit having a working fluid flowing therethrough and a plurality of light concentrating (LC) modules for converting light energy into electrical energy and for transforming the light energy into thermal energy. The LC modules including a first LC module coupled in series with a second LC module along the fluid circuit. The working fluid absorbs thermal energy while flowing through the first and second LC modules such that an amount of thermal energy in the working fluid increases as the working fluid flows through the second LC module. At least the first LC module includes a light concentrating optical element that is configured to direct light energy toward a focal region and a receiver held at the focal region. The receiver includes a housing having a chamber that holds an energy conversion member. The energy conversion member transforms light energy received from the optical element into electrical and thermal energy.

Optionally, the energy conversion member includes a photovoltaic (PV) cell for generating electrical energy. The working fluid may absorb thermal energy generated around the PV cell. Also, the first LC module may be a first type of LC module and the second LC module may be a second type of LC module. The second LC module may contain an energy conversion member that converts the light energy into only thermal energy.

In another embodiment, a method of manufacturing a LEC system for generating electrical and thermal energy is provided. The method includes coupling a first LC module to a fluid circuit. The first LC module includes a light concentrating optical element that is configured to direct light energy toward a focal region and a receiver held at the focal region. The receiver includes a housing having a chamber that holds an energy conversion member. The energy conversion member transforms light energy received from the optical element into electrical and thermal energy. The method also includes coupling a second LC module to the fluid circuit in series with the first LC module. The fluid circuit has a working fluid flowing therethrough such that the working fluid absorbs thermal energy while flowing through the first and second LC modules. An amount of thermal energy in the working fluid increases as the working fluid flows through the second LC module.

Optionally, the working fluid may flow entirely through the first LC module and then the second LC module. Also, an amount of thermal energy in the working fluid that exits the second LC module may be greater than an amount of thermal energy in the working fluid that exits the first LC module.

In another embodiment, a LEC system for generating electrical and thermal energy is provided. The system includes a fluid circuit that has a working fluid flowing therethrough and a plurality of LC module arrays that are coupled to the fluid circuit. Each array includes a first LC module and a second LC module coupled in series along the fluid circuit such that the working fluid absorbs thermal energy while flowing through the first and second LC modules. The first LC module is associated with a first operating temperature and the second LC module is associated with a second operating temperature. The system also includes an electrical circuit for conveying an electrical current therethrough. The first LC modules are electrically coupled in a first series to each other along the electrical circuit and the second LC modules are electrically coupled in a second series to each other along the electrical circuit.

Optionally the first LC modules may be configured to operate at a common operating current output with respect to each other and the second LC modules may be configured to operate at a common operating current output with respect to each other. Also, the first LC modules and the second LC modules may be of a common type of LC module.

In yet another embodiment, a method of manufacturing an LEC system for generating electrical and thermal energy is provided. The method includes providing a plurality of LC modules that are configured to convert light energy into electrical energy and to transform the light energy into thermal energy. Each LC module includes at least one photovoltaic (PV) cell that has a predetermined operating current output. The method also includes coupling the LC module to an electrical circuit and coupling the LC modules along a fluid circuit such that a working fluid flowing through the fluid circuit absorbs thermal energy in the LC modules. The LC modules are positioned along the fluid circuit such that the LC modules containing PV cells that have a higher operating current output are positioned upstream from the LC modules containing PV cells that have a lower operating current output.

Optionally the method may further include coupling the LC modules to a mounting structure. The mounting structure may be configured to align the LC modules with a light source.

BRIEF DESCRIPTION OF THE DRAWINGS

FIG. 3A is a perspective view of another type of LC module that may be used with the system shown in FIG. 1.

FIG. 3B is a perspective view of another type of LC module that may be used with the system shown in FIG. 1.

DETAILED DESCRIPTION OF THE INVENTION

As will be discussed in greater detail below, light concentrating (LC) modules (or light concentrators or light collectors) include reflective surfaces and/or refractive optical elements that are configured to concentrate light energy into or near a predetermined region where the light energy may be converted to electricity and/or may be used to heat a working fluid. As used herein, the term "light" or "light energy," is not limited to visible light or sunlight, but instead encompasses a wide range of wavelengths, as well as electromagnetic radiation of all wavelengths. As used herein, the term "working fluid" is any fluid or gas used to absorb and transfer thermal energy. As used herein, the term "optical element" means any material or apparatus that affects the propagation of light. An optical element may be configured to reflect light energy or refract light energy or both. A "non-imaging" optical element, as used herein, is an optical element that does not necessarily focus the light rays to a point or reproduce the image of the light reflected by the surface into a predetermined region or onto an energy conversion member. As used herein, the term "focal region" is not limited to a focal point or focal line but may include the region where the light rays reflected by a surface are substantially concentrated. A focal region includes a point-focal region or a linear-focal region.

Furthermore, as will be discussed below, embodiments described herein include LC modules that may be electrically and/or fluidicly coupled in series. As used herein, when the LC modules are fluidicly coupled in series, the entire flow or volume of the working fluid F flows through or flows partially around each subsequent LC module in the series without branching to flow through another LC module. By way of example, in some embodiments, a first portion of the working fluid F may be diverted into the LC module where the first portion is heated by the LC module. A second portion may be directed around (i.e., such that the second portion does not flow through the LC module or any other LC module) and rejoined with the first portion after the first portion has been heated. However, in other embodiments, the LC modules are fluidicly coupled in series such that the entire flow or volume of the working fluid flows entirely through each LC module (i.e., a portion of the flow is not directed around the LC module) and then entirely through each subsequent LC module.

However, although several LC modules may be in series, the embodiments described herein do not require all LC modules of a system to be in series. As such, some embodiments include only two LC modules in series. Other embodiments include three or more LC modules fluidicly coupled in series.

Figure 1:
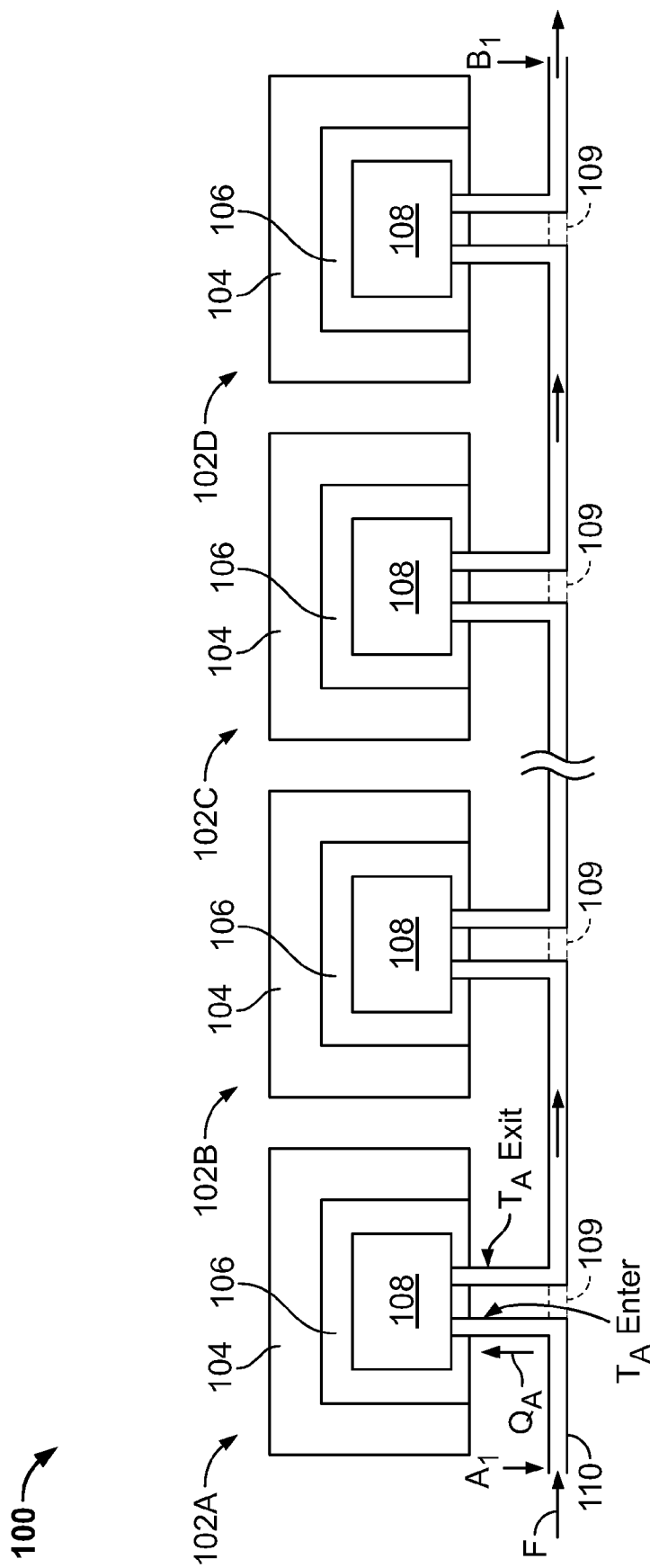
FIG. 1 is a schematic illustration of a light energy conversion (LEC) system formed in accordance with one embodiment.

FIG. 1 is a schematic illustration of a light energy conversion (LEC) system 100 formed in accordance with one embodiment. As shown, the LEC system 100 includes a plurality of LC modules 102A-102D that are each coupled to a fluid circuit 110. Each LC module 102 may include a light concentrating optical element 104, which may for example, include a reflective surface or a refractive element or some combination thereof. The LC module 102 is configured to direct light energy toward a focal region (not shown). The focal region may be a point-focal region or a linear-focal region. The LC module 102 may also include a receiver 106 that is coupled to the fluid circuit 110 and positioned proximate to the focal region. The receiver 106 houses and/or is attached to and holds an energy conversion member 108. In some embodiments, the receiver 106 is configured to facilitate directing the light energy toward the energy conversion member 108. When the LEC system 100 is in operation, the optical element 104 reflects/refracts the light energy toward the focal region. The energy conversion member 108 receives and transforms the impinging light energy into thermal and/or electrical energy. As the working fluid F flows through the fluid circuit 110, the working fluid F flows proximate to the energy conversion member 108 and absorbs thermal energy that is generated or transformed by the energy conversion member 108.

As shown, the working fluid F flows through the fluid circuit 110 from one point $A_1$ to another point $B_1$. The LC modules 102 are coupled to the fluid circuit between points $A_1$ and $B_1$. Points $A_1$ and $B_1$ may represent an inlet and an outlet, respectively, or just portions of the fluid circuit 110. For example, the fluid circuit 110 shown in FIG. 1 may be a separate channel running parallel to other channels where all of the channels join a main pipe. Moreover, the LC modules 102 may be coupled in series such that the entire flow or volume of the working fluid F flows through each subsequent LC module 102 without dividing or branching. Optionally the fluid circuit 110 may include bridge or connecting portions 109 that direct a portion of the working fluid F around the respective LC module 102.

As will be discussed in greater detail below, the LC modules 102A-102D may be any type of LC module or system. For example, the LC module 102 may be a light concentrating module as described in U.S. patent application Ser. No. 11/963,176, filed on Dec. 21, 2007, which is incorporated by reference in the entirety.

The LC modules 102A-102D may be co-generating LC modules that are configured to transform the light energy into both electrical and thermal energy. Alternatively, one or more of the LC modules 102A-102D may be configured to exclusively generate electrical energy or thermal energy. For example, in one embodiment, the LC modules 102A-102C are co-generating LC modules and the LC module 102D, the final LC module in the series, is configured to generate only thermal energy. In addition, in embodiments in which the LC modules 102 generate both electrical and thermal energy the LC modules may have different capabilities in transforming the light energy. As such, some LC modules may be configured to generate more thermal energy and less electrical energy than other LC modules in the series, whereas other LC modules may be configured to generate more electrical energy and less thermal energy than the other LC modules in the series.

In some embodiments, at least one LC module 102 or receiver 106 may be a modular unit that is removably coupled to the fluid circuit 110. As used herein, the term "removably coupled" means that the LC module is readily separable from the LEC system without destroying the LC module or the LEC system. For example, the LC module 102 may be coupled to the fluid circuit 110 using fasteners, such as screws, latches, buckles, and the like, where a technician may easily remove the LC module 102 using a tool or the technician's hands. In addition, the LC module 102 may be coupled to the fluid circuit 110 without an additional fastener such as by forming an interference or snap fit with the fluid circuit 110. Furthermore, in embodiments in which the LC module(s) 102 are configured to generate thermal energy when the LC module 102 is removably coupled to the fluid circuit 110 the LC module 102 may form a tight interface with the fluid circuit such that the working fluid F may flow therethrough. Also, the LC modules 102 may be separately removably coupled to the fluid circuit (i.e., the LC modules 102 may be removed one at a time) or the LC modules 102 may be connected to each other as a group or set and removably coupled to the fluid circuit 110 altogether.

However, alternative embodiments may include LC modules 102 that are not readily separable. Thus, as used herein, "coupled" includes being "removably coupled" and also includes the LC modules 102 being fused to or formed as part of the fluid circuit 110.

In embodiments where the LEC system 100 includes at least one LC module 102 that is removably coupled to the fluid circuit 110, the LEC system 100 may be reconfigured such that an operator or technician may rearrange, remove, or replace components of the system such as the LC modules 102, in order to affect the energy output of the LEC system 100. For example, one or more of LC modules 102 of a first type may be replaced with LC modules 102 of a second type in order to generate more or less thermal energy. Alternatively, the LC modules 102 may be replaced in order to optimize the total energy output of the LEC system 100.

In one embodiment the LEC system 100 includes LC modules 102 that are of at least two different types. As used herein, when LC modules 102 are of a common types the LC modules 102 are structurally similar and are manufactured to have a substantially common energy output. When LC modules 102 are not of the same types the LC modules 102 are structurally different and/or are manufactured to have different energy outputs.

Figure 2A:
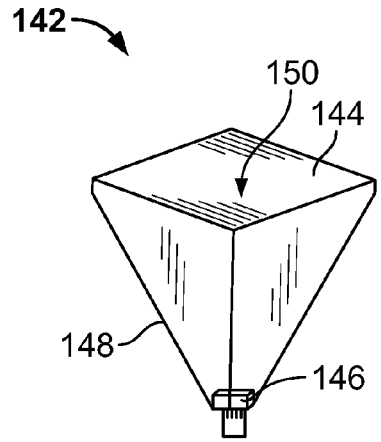
FIG. 2A is a perspective view of one type of light concentrating (LC) module that may be used with the system shown in FIG. 1.
Figure 2B:
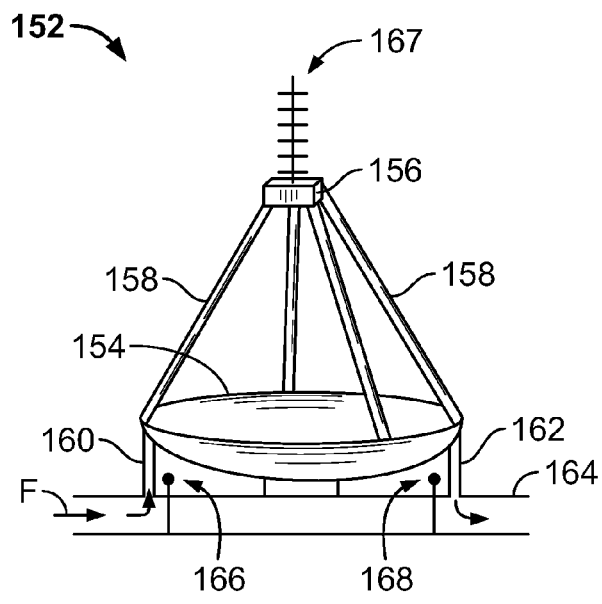
FIG. 2B is a perspective view of another type of LC module that may be used with the system shown in FIG. 1.
Figure 2C:
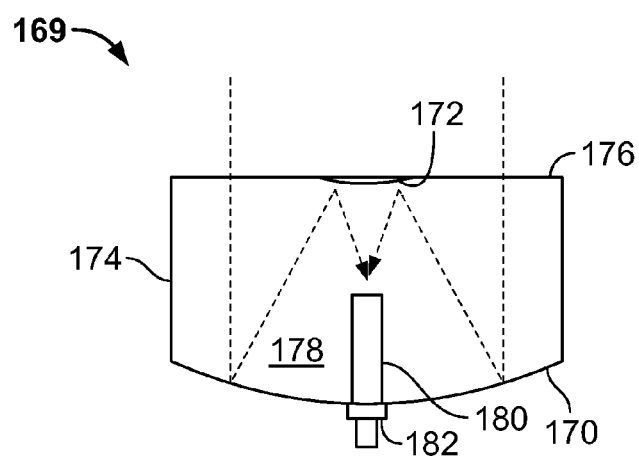
FIG. 2C is a cross-sectional view of another type of LC module that may be used with the system shown in FIG. 1.

FIGS. 2A-2C illustrate a variety of LC modules 142, 152, and 169, respectively, that may be used with the LEC system 100 (FIG. 1). FIG. 2A illustrates the LC module 142 having an optical element 144, a receiver 146, and a support body 148 connecting the receiver 146 to the optical element 144. The optical element 144 may be configured to direct (i.e., through refraction) light energy at least partially towards the receiver 146. The optical element 144 may be, for example, a Fresnel lens or a convex lens. The support body 148 may support the optical element 144 and form a chamber 150 therein. The chamber 150 may be partially or fully evacuated and filled with an inert gas, such as argon, helium, or nitrogen. Furthermore, the support body 148 may also serve as an optical element by having a reflective surface configured to direct the light energy toward the receiver 146. As discussed above, the receiver 146 may be coupled to a fluid circuit (not shown) and optionally includes a photovoltaic PV cell and/or a heat exchanger (not shown). As will be discussed below, the receiver 146 may optionally include an additional optical element (not shown) that is configured to direct light energy toward the PV cell and/or heat exchanger. Also, the receiver 146 may be configured to be removably coupled to the fluid circuit. As shown in FIG. 2A, in one embodiment, the components of the LC module 142 are fastened or coupled together such that the LC module 142 as a unit may be removably coupled to the fluid circuit. Furthermore, the LC module 142 may be sized and shaped such that the LC module 142 may be handheld or easily carried by an individual.

FIG. 2B is a perspective view of the LC module 152. The LC module 152 is a reflective type of LC module and includes an optical element 154, a receiver 156, and a plurality of support members 158 that connect the optical element 154 to the receiver 156. As shown, the optical element 154 may have a reflective surface configured to direct light energy toward the receiver 156. The support members 158 may include passages (not shown) for carrying a fluid to the receiver 156. The support members 158 may also include conduits containing the wires that carry the current produced by the PV cell. The passages within the support members 158 may fluidicly couple to conduits 160 and 162 that are coupled to a fluid circuit 164. When the LC module 152 is coupled to the fluid circuit 164, valves 166 and 168 may be completely or partially closed in order to direct at least a portion of the flow of the working fluid F through the receiver 156. Optionally, the LC module 152 may include an ambient air heat exchanger 167 that extends outward away from the receiver 156. In an alternative embodiment the LC module 152 is not fluidicly coupled to the fluid circuit 164, but only includes a PV cell (not shown) for converting the light energy into electrical energy.

FIG. 2C is a cross-sectional view of the LC module 169. As shown, the LC module 169 includes a primary optical element 170 and a secondary optical element 172. The secondary optical element 172 may be a non-imaging optical element. The LC module 169 also includes a support body 174 and a transparent and/or refractive cover 176. The support body 174 connects the cover 176 to the primary optical element 170. Similar to the LC module 142 discussed above, the LC module 169 may form a chamber 178 between the cover 176, the support body 174, and the primary optical element 170. The secondary optical element 172 is attached to and supported by the cover 176. Also shown, the LC module 169 includes a light pipe 180 positioned at and extending from a center of the primary optical element 170. When light approaches the LC module 169, the light passes through the transparent cover 176 reflects from the primary optical element 170 toward the secondary optical element 172, and then reflects from the secondary optical element 172 toward the light pipe 180. The light pipe 180 is configured to direct the light toward a receiver 182, which may include a PV cell and/or heat exchanger (not shown). The receiver 182 may be coupled to a fluid circuit (not shown).

However, the above discussion regarding LC modules 142, 152, and 169 is not intended to be limiting. The LEC system 100 may be utilized with a variety of LC modules including, for example, light concentrating modules that include a plurality of receivers that share a common optical element or system. Such light concentrating modules are described in U.S. patent application Ser. No. 11/963,176, filed on Dec. 21, 2007, which is incorporated by reference in the entirety. In such embodiments, each LC module may have more than one PV cell. Furthermore, although the above examples illustrate the PV cells being held within a receiver, alternative embodiments may not include a receiver. Rather, the PV cell may be directly attached to, for example, an outer pipe surface of the fluid circuit.

Also, FIGS. 2A-2C illustrate point-focus LC modules 142, 152, and 169. Alternative embodiments of the LEC system 100 may be used with linear-focus LC modules such as LC module 184 illustrated in FIGS. 3A and 3B. As shown in FIG. 3A, the LC module 184 may include an optical element 186, a receiver 188, and support members 190 that connect the receiver 188 to the optical element 186. The optical element 186 is configured to direct (i.e., through refraction) light energy at least partially towards the receiver 188. As shown in FIG. 3A, the receiver 188 has an elongated body that includes a PV cell or plurality of PV cells 194 extending linearly along the body of the receiver 188. A fluid circuit 192 may flow underneath the plurality of PV cells 194. A heat exchanging system (not shown) may interact with the fluid flow in order for thermal energy to be absorbed by the working fluid F. Similar to above, the receiver 188 may be configured to be removably coupled to the fluid circuit. When the LC module 184 is removed, a pipe may replace the LC module 184 in order for the LEC system 100 to remain in operation without the LC module 184.

FIG. 3B illustrates a reflective LC module 185 that includes an optical element 187 and a receiver 189 that is coupled to a fluid circuit 191. The optical element 187 is configured to direct (i.e., through reflection) light energy at least partially towards the receiver 189. In the illustrated embodiment the receiver 189 is not coupled or attached to the optical element 187, however, the receiver 189 may be coupled to an optical element in alternative embodiments. The optical element 187 is connected by support members (not shown) to the fluid circuit 191 or to some other structure. The support members may be operated to tilt and/or rotate the optical element 187 in order for the optical element 187 to be properly aligned with the light source. As shown in FIG. 3B, the receiver 189 has an elongated body that includes a PV cell or plurality of PV cells (not shown) extending linearly along the body of the receiver 189 and facing toward the optical element 187. When in operation, the working fluid F flows through the fluid circuit 191 and the receive 189. A heat exchanging system (not shown) may interact with the fluid flow in order for thermal energy to be absorbed by the working fluid F.

The receiver 189 may be configured to be removably coupled to the fluid circuit 191 at points $A_3$ and $B_3$. Furthermore, the optical element 187 may be separately removably coupled to the LEC system 100. When the LC module 185 is removed, valves (not shown) may be manipulated in order to direct the fluid flow through a connecting portion 195 that flows under the optical element 187 so that the LEC system 100 may remain in operation without the LC module 185.

Figures 4A, 4B:
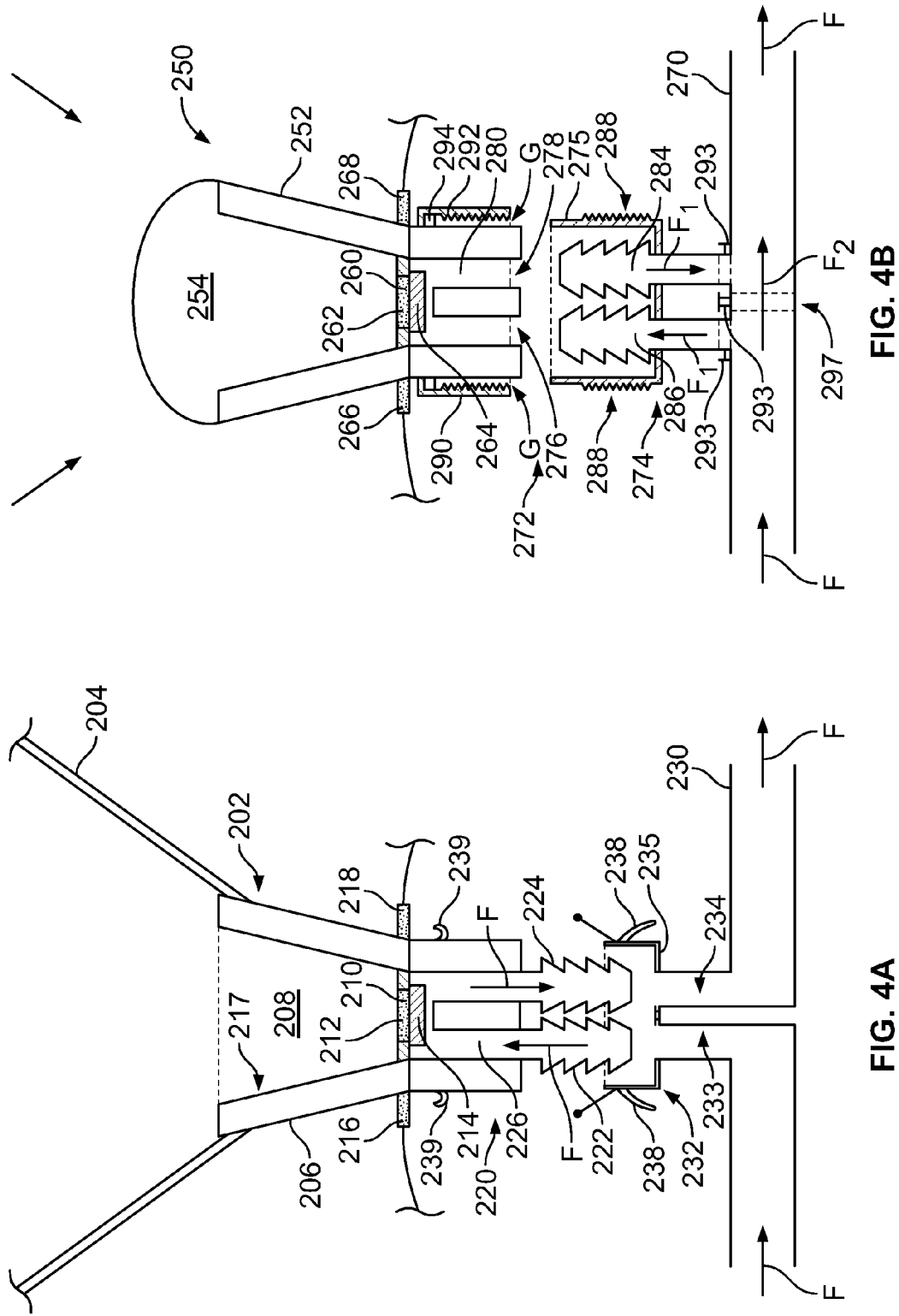
FIG. 4A is a cross-sectional view of a receiver that may be used with the LC modules shown in FIGS. 2A-2C.
FIG. 4B is a cross-sectional view of another receiver that may be used with the LC modules shown in FIGS. 2A-2C.

FIGS. 4A and 4B are cross-sectional views of receivers 202 and 250, respectively, that may be used with a variety of LC modules, such as the LC modules 142, 152, and 169 (FIGS. 2A-2C). FIG. 4A illustrates the receiver 202 attached to a support body 204, which connects the receiver 202 to an optical element (not shown). The optical element may be configured to direct light toward the receiver 202. Alternatively, the support body 204 is an optical element, such as the optical element 170 shown in FIG. 2C. The receiver 202 includes a housing 206 forming a cavity or chamber 208 therein that includes an energy conversion member 210. The housing 206 may have an inner reflective surface 217 that is also configured to direct light energy toward the energy conversion member 210. Optionally the housing 206 may hold a solid optical element (not shown) being shaped to direct (i.e., through refraction) the light energy toward the energy conversion member 210. In FIG. 4A, the energy conversion member 210 is illustrated as a PV cell 212 that is affixed to a heat exchanger 214 (e.g., a heat sink) by a thermally conductive resin. However, the energy conversion member 210 may be, for example, only one PV cell or only a heat/thermal energy absorber. Furthermore, the energy conversion member 210 may be a plurality of PV cells arranged adjacent or abutting each other in alternative embodiments. When the light energy impinges the energy conversion member 210, the thermal energy is conducted through the heat exchanger 214 and absorbed by the working fluid F. Furthermore, for embodiments where the receiver 202 is co-generating, the receiver 202 may include electrical terminals 216 and 218 which electrically connect the PV cell 212 to an electrical circuit (not shown).

Also shown, the receiver 202 may be configured to be removably coupled to a fluid circuit 230. As such, the housing 206 of the receiver 202 may from a bottom portion 220 that is configured to be inserted into a corresponding port opening 232 of the fluid circuit 230. The bottom portion 220 includes an inlet 222 and an outlet 224 that share a flow passage 226 therebetween. The heat exchanger 214 is positioned within the flow passage 226. The port opening 232 includes two conduits 233 and 234 that are configured to engage inlet 222 and outlet 224, respectively. The port opening 232 has a body 235 configured to receive the bottom portion 220 of the receiver 202. The port opening 232 may have one or more latches 238 attached to an outer surface thereof. Also, the bottom portion 220 may also include hooks 239 that are configured to engage the latches 238.

When the receiver 202 is inserted into the port opening 232, the inlet 222 and outlet 224 are inserted into the conduits 233 and 234, respectively. The inlet 222 and outlet 224 may have ridges that compress when inserted into the conduits 233 and 234 thereby forming a seal to prevent leakage of the working fluid F. The latches 238 may then engage the hooks 239 thereby removably coupling the receiver 202 to the fluid circuit 230. Alternatively, the bottom portion 220 of the receiver 202 is configured to form an interference fit with the port opening 232 without using additional fasteners, such as the hooks 239 and the latches 238.

FIG. 4B is a cross-sectional view of another receiver 250 that may be used with the LC modules 142, 152, and 169 (FIGS. 2A-2C). As shown, the receiver 250 may be separate from a primary optical element (not shown) that directs the light toward the receiver 250. The receiver 250 may include a housing 252 forming a cavity that holds a solid optical element 254. The optical element 254 may cooperate with the primary optical element and be shaped to direct (i.e., through refraction) the light energy. The receiver 250 also includes an energy conversion member 260 illustrated as a PV cell 262 that is affixed to a heat exchanger 264 (e.g., a heat sink) by a thermally conductive resin. When the light energy impinges the energy conversion member 260, the thermal energy is conducted through the heat exchanger 264 and absorbed by the working fluid F. Similar to the receiver 202, the receiver 250 may include electrical terminals 266 and 268 which provide an electrical connection to the PV cell 262.

The receiver 250 may also be configured to be removably coupled to a fluid circuit 270. As such, the housing 252 of the receiver 250 may form a bottom portion 272 that is configured to be inserted into a corresponding port opening 274 of the fluid circuit 270. The bottom portion 272 may define conduits 276 and 278 that have a flow passage 280 therebetween. The heat exchanger 264 is positioned within the flow passage 280. The bottom portion 272 may be surrounded by a coupling member 290 that forms a gap G between an outer surface of the bottom portion 272 and an inner surface of the coupling member 290. The inner surface of the coupling member may have threads 292 projecting inward therefrom.

Also shown, the port opening 274 includes an inlet 284 and an outlet 286 that are configured to engage conduits 278 and 276, respectively. The port opening 274 has a body 275 configured to receive the bottom portion 272 of the receiver 250. Also shown, the body 275 may have threads 288 projecting from an outer surface of the body 275.

When the receiver 250 is inserted into the port opening 274, the inlet 284 and outlet 286 are inserted into the conduits 278 and 276 respectively. The inlet 284 and outlet 286 may have ridges that compress when inserted into the conduits 278 and 276, respectively, thereby forming a seal to prevent leakage of the working fluid F. The threads 292 of the coupling member 290 may engage the threads 288. The coupling member 290 may then be rotated around the body 275 of the port opening 274 in order to couple the receiver 250 to the fluid circuit 270. When the bottom portion 272 is fully inserted into the port opening 274, a sealing member 294 (e.g., o-ring) may be compressed by the body 275 of the portion opening 274.

The description of the above mechanisms in FIGS. 4A and 4B for removably coupling LC modules to a fluid circuit is not intended to be limiting. Those having ordinary skill in the art understand that there are a variety of mechanisms for removably coupling receivers to a fluid circuit. Furthermore, when an LC module is removed from the fluid circuit, a cap may be inserted over the port opening. The cap may be configured to allow the flow of the working fluid therethrough. As such, the LEC system may still function properly if an LC module is removed.

In one embodiment, each receiver in the LEC system is configured to have a common mechanism for attaching to the fluid circuit. As such, even though the LC modules may be of different types, the LC modules may be inserted into any port opening and rearranged with respect to each other. Alternatively, each port opening may be configured to receive an LC module of a certain type in order to prevent an operator or technician from inserting the wrong type of LC module into the port opening.

FIG. 4B also illustrates that a portion of the working fluid F may be diverted or directed around the receiver 250. More specifically the fluid circuit 270 and/or the receiver 250 may include one or more valves 293 (or a valve system) that is configured to divert portions of the working fluid F. For example, the working fluid F may be diverted into a first portion $F_1$ and a second portion $F_2$. The first portion $F_1$ may be directed through the receiver 250 such that the first portion $F_1$ absorbs thermal energy. The second portion $F_2$ may be directed around the receiver 250 through a connecting portion 297 of the fluid circuit 270 and then rejoined with the first portion $F_1$ after the first portion $F_1$ has been heated. As shown, the connecting portion 297 flows near the receiver 250 such that the first and second fluid portions $F_1$ and $F_2$ are immediately joined after the first portion is heated. When the first portion $F_1$ rejoins the second portion $F_2$, the two portions $F_1$ and $F_2$ mix and the temperature of the working fluid F settles between the temperature of the first portion $F_1$ and the temperature of the second portion $F_2$. As such, the temperature increase between LC modules that are fluidicly coupled in series may be controlled. Furthermore, if the receiver 250 is removed, the valves 293 may be operated to direct the entire fluid flow the connecting portion 297.

Furthermore, the valves 293 may be operated to direct the entire volume of working fluid F through the connecting portion 293 when, for example, the LC module is removed from the fluid circuit 270. Alternatively, the valves 293 may be configured to direct all of the flow through the receiver 250. In addition, the valves 293 may be configured to control the division of flow (i.e., flow rate or flow volume passing through the respective valve 293) according to an electronically controlled, dynamic system. Such a system may rely on temperature and flow inputs of the working fluid F that are determined by sensors (not shown). The sensors may also be positioned near or on the PV cell and register inputs regarding the working fluid F around the PV cell or the temperature of the PV cell itself. As such, the system may be automated to operate/control the flow of working fluid F flowing through the first and second portions $F_1$ and $F_2$ by operating the valves 293.

In alternative embodiments, the first and second portions $F_1$ and $F_2$ may both flows through the corresponding receiver. For example, the first portion $F_1$ may flows through the receiver 250 as shown in FIG. 4B. The second portion $F_2$ may branch or divert away before reaching the heat exchanger and flow under the first portion $F_1$ in a separate channel within the receiver 250.

Figure 5:
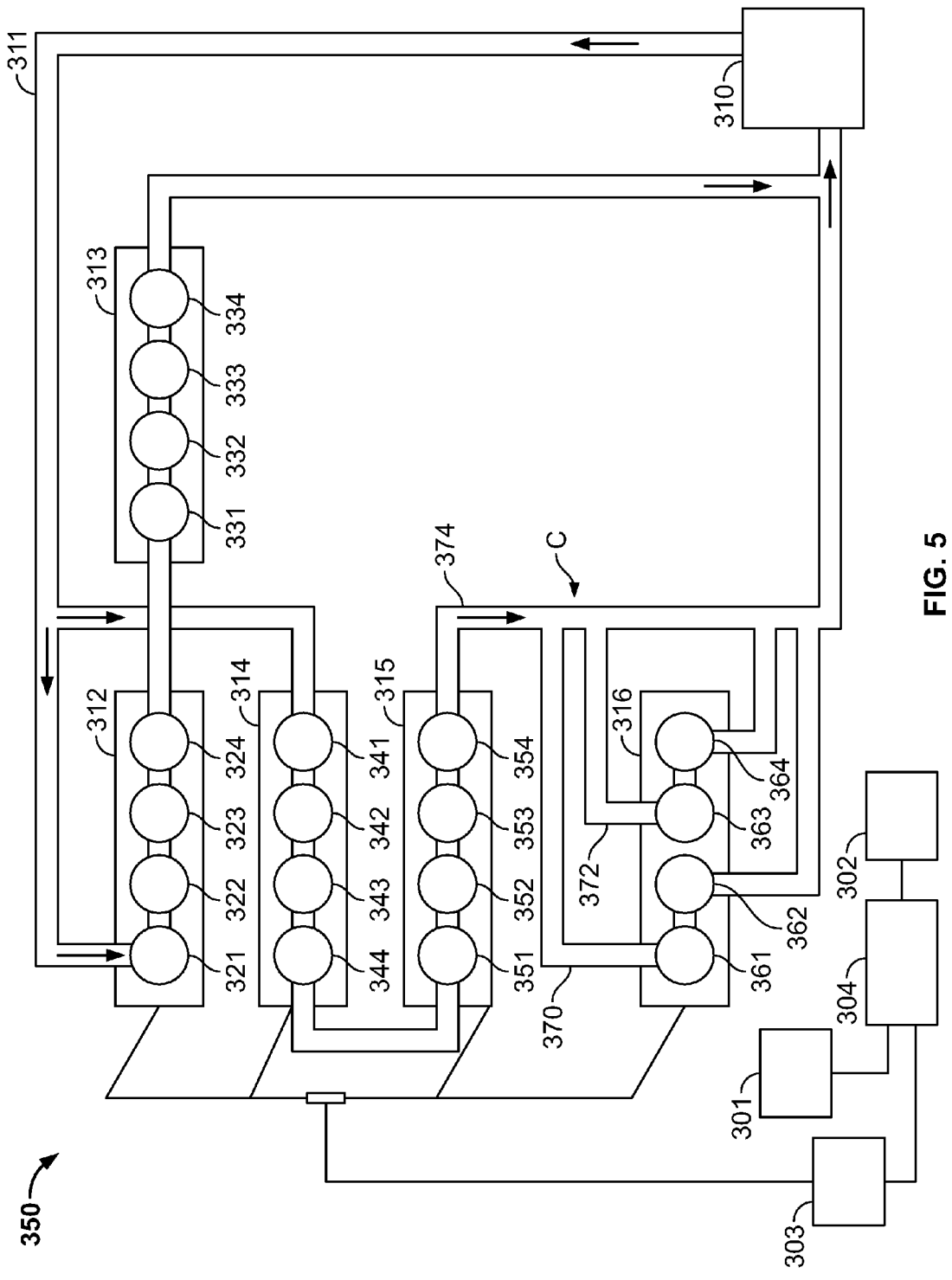
FIG. 5 is a schematic illustration of an LEC system that may be formed in accordance with another embodiment.

FIG. 5 is a schematic illustration showing an LEC system 350 formed in accordance with one embodiment. The LEC system 350 includes a plurality of arrays 312-316, each array having a plurality of LC modules (discussed below) that are connected in series to a fluid circuit 311. In some embodiments, an array includes at least three (3) LC modules. Also, although each array 312-316 shows only one row of LC modules, the arrays 312-316 may have more than one row. The LEC system 350 also includes a source detector 302 that receives light energy from a light source (not shown) and determines the location of the light source relative to the system 350. The source detector 302 is communicatively coupled to a source tracking unit 304 and sends information relating to the light source location to the tracking unit 304. The tracking unit 304 is communicatively coupled to servo motors 301, 303. The tracking unit 304 stores information relating to the incident direction (not shown) for the LC modules within the arrays 312-316. When the tracking unit 304 receives location information from the source detector 302 the tracking unit 304 determines if the incident direction for the LC modules is directed toward the location. If the incident direction is not directed toward the light source, the tracking unit 304 instructs one or both of the servo motors 301, 303 to tilt and/or rotate, respectively, the arrays 312-316 so that the incident direction is directed toward the light source.

The LEC system 350 also includes a fluid conversion system 310 coupled in flow communication to the fluid circuit 311. The direction of flow of the working fluid F is indicated by arrows throughout the fluid circuit 311. In one embodiment, the fluid conversion system 310 receives the heated working fluid F and converts the absorbed thermal energy into electrical energy. Although not shown, the fluid conversion system 310 may include a pump, valves, tanks, and/or other fluid devices that facilitate regulating the flows of the working fluid F. Alternatively, the fluid conversion system 310 may store the heated working fluid F and/or direct the flow of the working fluid F to other locations where, for example, the working fluid F may be used for heating.

FIG. 5 also illustrates how the LC modules may be connected to the fluid circuit 311 in different arrangements. As an example of one arrangement that may be used, the fluid circuit 311 connects to the array 312 which includes LC modules 321-324. The working fluid F first enters and flows through the LC module 321 and then flows sequentially through 322, 323, and 324. The working fluid F then exits the array 312 and extends across in a linear manner connecting to the array 313 having LC modules 331-334. Similarly the working fluid F first enters and flows through the LC module 331 and then flows through 332-334 in sequence. As shown, the working fluid F flows through two arrays 312, 313 in series and, consequently LC modules 321-324 and 331-334 in series. In a similar arrangement, the array 314 extends along and adjacent to the array 315 such that the arrays 314 and 315 have a stacked relationship. The working fluid F enters the array 314 and flows through the LC module 341 and then flows through 342-344 in sequence. The fluid circuit 311 exits the array 314 and turns toward the adjacent array 315, which includes LC modules 351-354. The fluid circuit 311 connects to LC module 351 and then flows in series through each remaining LC module 352-354. As such, the working fluid F flows in series through two arrays (arrays 312 and 313 in one arrangement, and arrays 314 and 315 in another) of LC modules thereby heating the working fluid F.

FIG. 5 also illustrates that the fluid circuit 311 may flow through LC modules in parallel. As shown, the array 316 includes LC modules 361-364. At point C, the fluid circuit 311 includes a main pipe 374 that has two channels 370 and 372 that diverge from the main pipe 374. The channel 370 flows through the LC modules 361 and 362 in series, and the channel 372 flows through the LC modules 363 and 364 in series. The channels 370 and 372 then return the working fluid F to the main pipe 374.

Figure 6:
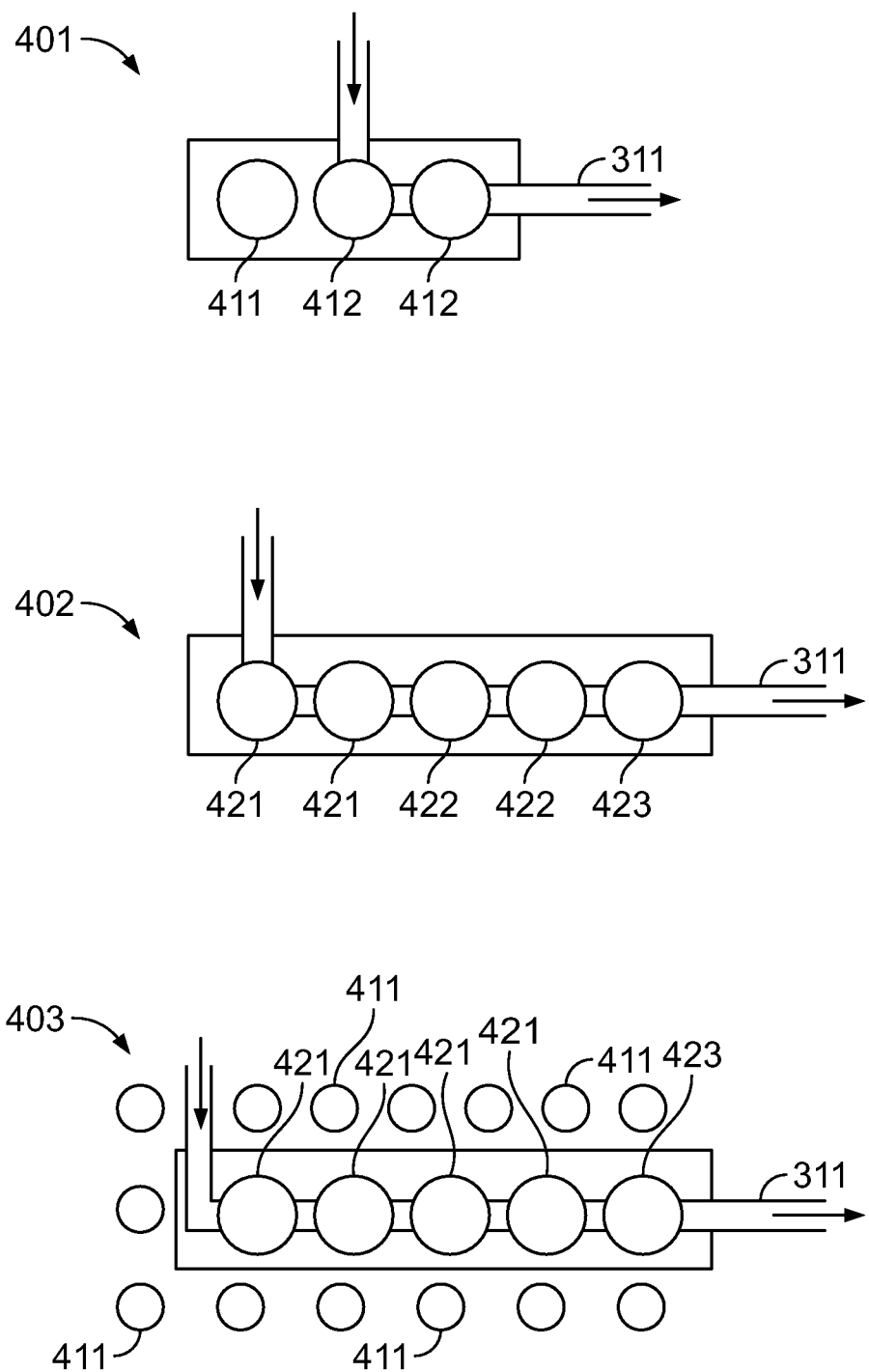
FIG. 6 is a schematic illustration of an LEC system that may be formed in accordance with an alternative embodiment.

FIG. 6 shows three different arrays 401-403 that illustrate different arrangements of LC modules that may be used with the LEC system 350 (FIG. 5). The array 401 includes LC modules 411 and 412. The LC module 411 is configured to convert light energy into only electrical energy and co-generating LC modules 412 are configured to convert light energy into thermal and electrical energy. The three LC modules 411-412 in the array 401 may or may not be electrically coupled in series. The array 402 includes a plurality of LC modules 421, 422, and 423 in series on the fluid circuit 311. The LC module 421 is one type of co-generating LC module that converts the light energy into both electrical and thermal energy and the LC module 422 is another type of co-generating LC module that converts the light energy into both electrical and thermal energy. For example, the LC modules 421 and 422 may use different optics and/or different receiver systems and/or have different types of PV cells. However, the LC module 423 is configured to transform the light energy into substantially thermal energy.

The array 403 includes a plurality of LC modules 421 and 423 connected in series to the fluid circuit 311. The LC modules 421 are co-generating LC modules that convert the light energy into both electrical and thermal energy and the LC module 423 is configured to convert the light energy into substantially thermal energy. A plurality of the LC modules 411 surround the series of LC modules 421 and 423. The LC modules 411 are configured to convert the light energy into only electrical energy.

With reference again to FIG. 1, while flowing through the fluid circuit 110, the working fluid F has a flow rate Q and a temperature T. The working fluid F enters the LC module 102A with flow rate $Q_A$ and starting temperature $T_{A\ enter}$ and exits the LC module 102A with a temperature $T_{A\ exit}$, with $T_{A\ enter} < T_{A\ exit}$. Therefore, the total increase of the fluid temperature after flowing through the LC module 102A is $\Delta T = T_{A\ exit} - T_{A\ enter}$. Thus, the temperature relationship for the working fluid F exiting the LC modules 102A-102D is given by $T_{i\ exit} = T_{i\ enter} + \Delta T_i$. As the working fluid F enters each LC module in the series, the temperature is given by $T_i = T_{i\ exit} - \Delta T'_i$, where $\Delta T'_i$ represents any drop in temperature caused by exchange of heat between the fluid transport pipes and the environment and is generally less than the value of $\Delta T_i$.

In one embodiment, the series of LC modules 102A-102D includes both combined PV/thermal LC modules and at least one purely thermal LC module. In this example, the final temperature of the working fluid as it exits the system at point $B_1$ is given by:

$$T_{n\ exit} = T_{1\ enter} + \Sigma_{i=1\ to\ M}\Delta T_i + \Sigma_{i=1\ to\ N-M}\Delta T_i - \Sigma_{i=1\ to\ N-1}\Delta T'_i; \quad \text{(Equation 1)}$$

where there are M combined PV/thermal LC modules in the series and (N−M) purely thermal LC modules.

In such a configuration, the working fluid F can achieve high levels of stored thermal energy. For example, the temperature of the working fluid F leaving the LC module 102D may be over 110° C. The working fluid F may then be used in a variety of applications, such as space heating, cooling, and low to mid-grade industrial process heating. Table 1 illustrates the estimated operation of one embodiment where the LC modules are in series. In this example, the set included six LC modules arranged in series where the first five are co-generating PV LC modules the last LC module is configured to exclusively transform the light energy into thermal energy. Also, the flows rate of the fluid, $Q_A$ was 3 liters/hour; the receiver area of each LC module was 100 mm² the incoming temperature of the water ($T_{A\ enter}$) was 20° C., the heat exchangers were connected with copper tubing of length 50 mm between each LC module where the thermal conductivity of the insulated copper tubing was 0.0397 W/mK. As shown in Table 1, a working fluid entering the system at 20° C. can achieve a temperature of 107° C. The first three PV cells operate at temperatures that allow high efficiency (performance degradation not exceeding 1 to 2%), while the fourth and fifth may have a reduction in conversion efficiency that may range from 3% to 4%.

TABLE 1

|  | LC module | | | | | |
| --- | --- | --- | --- | --- | --- | --- |
|  | 1 | 2 | 3 | 4 | 5 | 6 |
| LC module Type | PV/Thermal | PV/Thermal | PV/Thermal | PV/Thermal | PV/Thermal | Purely Thermal |
| Heat Exchanger | 1 | 2 | 3 | 4 | 5 | 6 |

TABLE 1-continued

| | LC module | | | | | |
|---|---|---|---|---|---|---|
| | 1 | 2 | 3 | 4 | 5 | 6 |
| Thermal incident on receiver surface [W] | 57 | 57 | 57 | 57 | 57 | 82 |
| Entrance temperature ($T^e_i$) of water [° C.] | 20 | 34.8 | 49.2 | 62.5 | 75 | 86 |
| Temperature of the PV cell [° C.] | 51 | 63 | 77 | 91 | 103 | — |
| Temperature increase ($\Delta T_i$) of water [° C.] | 15 | 15.2 | 14.8 | 14.5 | 14 | 21 |
| Exit temperature ($T^u_i$) of water [° C.] | 35 | 50 | 64 | 77 | 89 | 107 |
| Decrease in fluid temperature ($\Delta T_j$) in pipes connecting the heat exchangers | .2 | .8 | 1.5 | 2 | 3 | |

Figure 7:
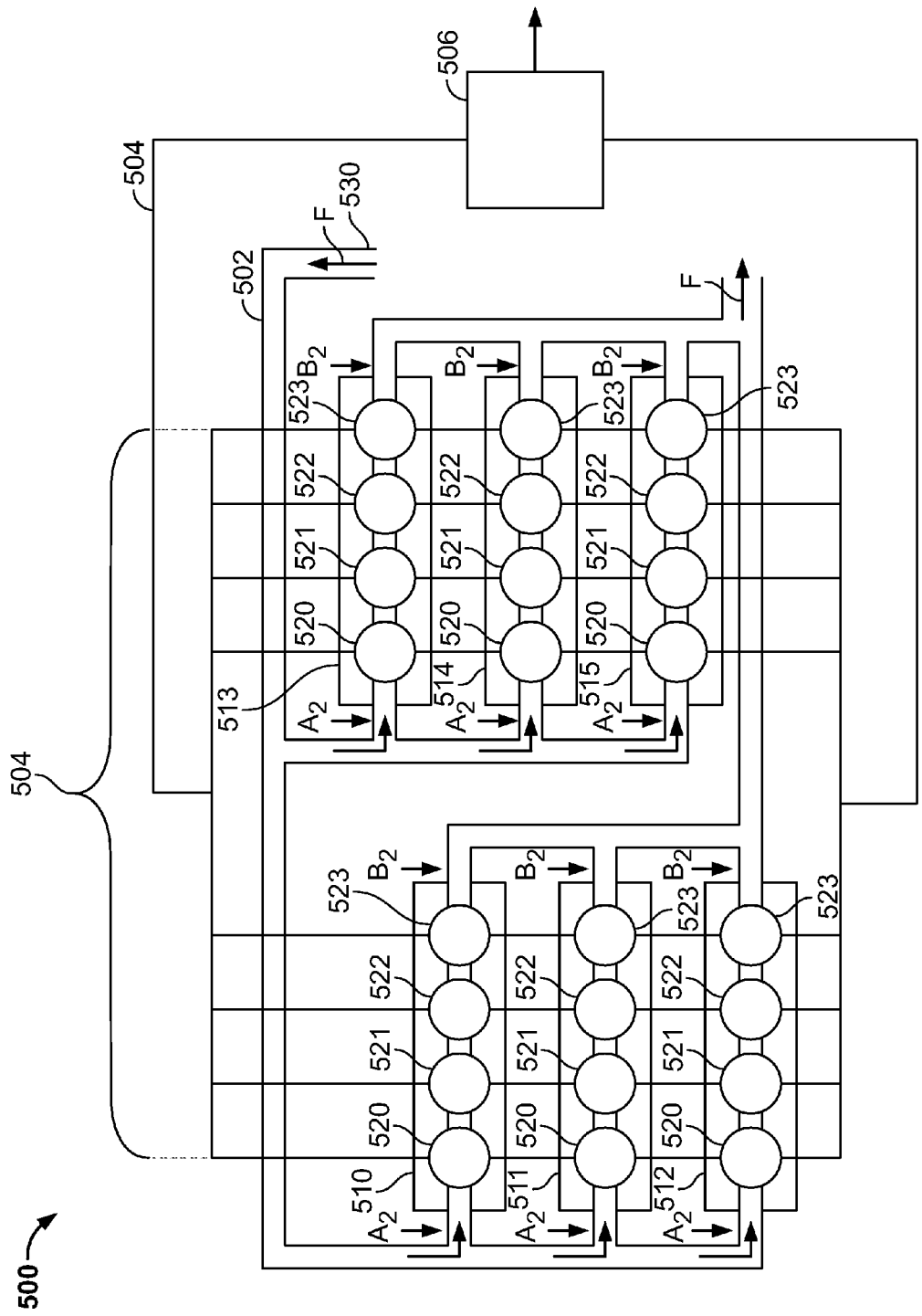
FIG. 7 is a schematic illustration of an LEC system that may be formed in accordance with another embodiment.
Figure 8:
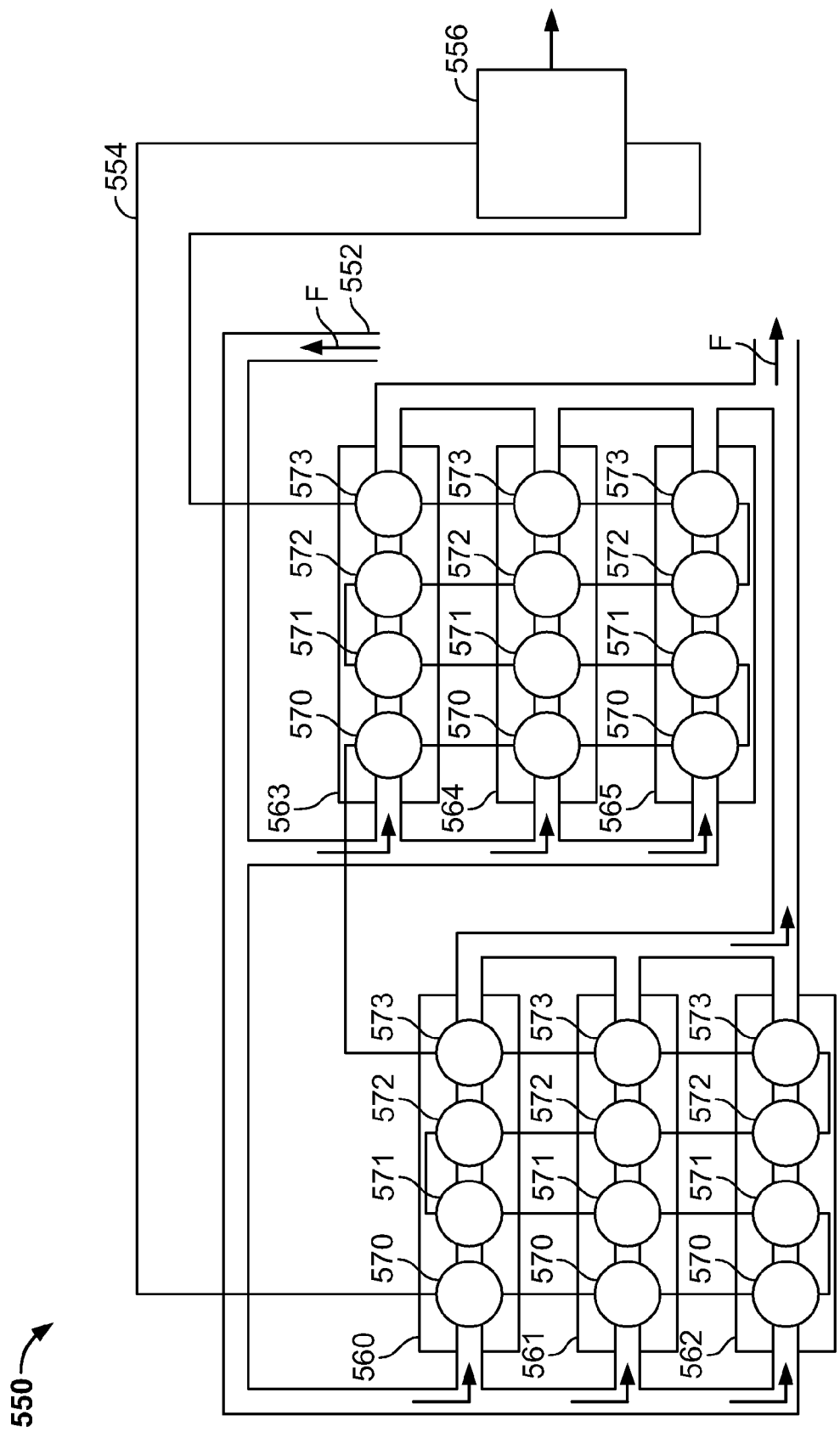
FIG. 8 is a schematic illustration of an LEC system that may be formed in accordance with another embodiment.

FIGS. 7 and 8 illustrate embodiments for electrically interconnecting a plurality of LC modules, such as the LC modules discussed above. In these embodiments, the LEC systems and LC modules are configured in order to match the current generated by the PV cells while the LEC system is in operation even though the PV cells may be operating in different conditions (e.g., different temperature of the working fluid). Furthermore, in some embodiments, all or a large group of LC modules may be connected in series in order to build voltage.

FIG. 7 is a schematic illustration of an LEC system 500 formed in accordance with one embodiment that is configured to generate electrical and thermal energy. As shown, the LEC system 500 includes a fluid circuit 502 having the working fluid F flowing therethrough. The LEC system 500 may also include a plurality of light concentrating (LC) module arrays 510-515 that are coupled to the fluid circuit 502. Each array 510-515 may be positioned on a separate fluid channel of the fluid circuit 502 where the separate fluid channels eventually combine into one main channel or pipe. Also, the arrays 510-515 may include a plurality of LC modules 520-523 that are fluidicly coupled in series to each other along the fluid circuit 502. The LEC system 500 also includes an electrical circuit 504 for conveying an electrical current therethrough. The electrical circuit 504 connects PV cells (not shown) that are held by corresponding LC modules 520-523 to an inverter system 506 for converting the direct-current generated power to alternating-current. The LC modules 520-523 may be any of a variety of LC modules, including the LC modules 142, 152, 169, 184, and 185 discussed above.

When in operation, the working fluid F branches out and flows through the separate channel of each array 510-515. The working fluid F that flows through the array 510 enters the array 510 at a point $A_2$ and sequentially flows through each LC module 520-523 and then out of the array 510 at a point $B_2$. As discussed above, when the working fluid F flows through each LC module 520-523 the heat exchanger (not shown) in each LC module 520-523 transfers the thermal energy from the corresponding heat exchanger into the working fluid F. As such, the temperature of the working fluid F increases as the working fluid F flows through each subsequent LC module 520-523. In one embodiment, the temperature increase of the working fluid F is approximately 10-15° C. after each subsequent LC module. In an alternative embodiment, the temperature increase may be less if, for example, the working fluid F is diverted into first and second fluid portions $F_1$ and $F_2$ as discussed above with reference to FIG. 4B.

When the temperature of a PV cell increases, the ability of the PV cell to generate electrical energy may be affected. For each type of PV cell, a relationship exists between the operating temperature of the PV cell and the amount of electrical energy generated by the PV cell. Thus, in order to avoid current mismatch losses by PV cells coupled in series to each other, the LEC system 500 may be configured such that the temperature of the working fluid F associated with each LC module 520 for each array 510-513 may be approximately equal. More specifically the LEC system 500 may be configured so that each LC module 520 is associated with a first operating temperature, each LC module 521 is associated with a second operating temperature that is higher than the first operating temperature, each LC module 522 is associated with a third operating temperature that is higher than the second operating temperature, and each LC module 523 is associated with a fourth operating temperature that is higher than the third operating temperature. As such, the current generated by one LC module on an array may be approximately equal to the current generated by another LC module on another array that operates at approximately the same temperature. By electrically connecting these LC modules in series, current mismatch losses may be reduced.

In FIG. 7, each LC module 520 of arrays 510-512 is connected in series to each other and each LC module 520 of arrays 513-515 is connected in series to each other. These separate lines may then be connected in parallel. However, in one alternative embodiment, each LC module 520 of array 510-515 shown in FIG. 7 may be connected in series to each other.

FIG. 8 is a schematic illustration of an LEC system 550 formed in accordance with one embodiment that is configured to generate electrical and thermal energy. The LEC system 550 includes a fluid circuit 552 having the working fluid F flowing therethrough. The LEC system 550 may also include a plurality of light concentrating (LC) module arrays 560-565 that are coupled to the fluid circuit 552, and each array 560-565 may include a plurality of LC modules 570-573 that are coupled in series to each other along the fluid circuit 552 such that the working fluid F absorbs thermal energy while flowing through each subsequent LC module. The LEC system 550 also includes an electrical circuit 554 for conveying an electrical current therethrough. The electrical circuit 554 connects PV cells (not shown) that are held by corresponding LC modules to each other and to an inverter system 556 for converting the DC generated power to AC.

Before coupling to the LEC system 550, the LC modules 570-573 may be tested to determine a nominal current output of each LC module. (The "nominal" current output reflects the current output during test conditions. The "operating" current output reflects the current generated by the PV cell during normal operation.) Due to various reasons, after being manufactured, LC modules of a common type may have different power and/or current outputs. One possible source of variation is often the PV cell itself. Other causes could be the variability in the optical efficiency of the concentrating optics, alignment errors, or other general inaccuracies during module manufacture and assembly. Thus, the PV cells or the LC modules that have similar power outputs may be grouped together. In one embodiment, the voltage of each PV cell (or LC module) is determined while operating at the maximum power point. Each PV cell (or LC module) is then placed in bins according to the current at the maximum power point voltage. In this way PV cells or LC modules with similar current outputs can be connected in series with minimal current mismatch losses. Also, as discussed above, when the temperature of a PV cell increases, the ability of the PV cell to generate electrical energy may be affected. For example, for every increase in temperature of 10-15° C. the current output for a PV cell may be increased by approximately 0.07 A to 0.1 A, while the voltage may decrease by approximately 0.06V to 0.09V.

In some embodiments, the LC modules 570-573 may be positioned along the fluid circuit 552 such that the LC modules containing PV cells having a higher nominal current output are positioned upstream from the LC modules containing PV cells having a lower nominal current output. For example, under controlled standard test conditions (such as 25° C., ASTM G173-03 spectrum, 50 W/cm²), a nominal current output of the LC modules 570 may be approximately equal to 6.5 A, a nominal current output of the LC modules 571 may be approximately equal to 6.4 A, a nominal current output of the LC modules 572 may be approximately equal to 6.3 A, and a nominal current output of the LC modules 573 may be approximately equal to 6.2 A.

When connected to the fluid circuit, the LC modules 570-573 may experience different operating temperatures of the working fluid F similar to that shown in Table 1. For example, the operating temperature of the working fluid F flowing through the LC module 571 may be 10° C.-15° C. higher than the operating temperature of LC module 570. The operating temperature of LC module 572 may be 10° C.-15° C. than the operating temperature of LC module 571, and the operating temperature of LC module 572 may be 10° C.-15° C. higher than the operating temperature of LC module 573. As such, the LC modules may be arranged along the fluid circuit such that all or a large group LC modules have an operating current of approximately 6.5 A. In this way, the modules 570-573 may all be connected in series with reduced losses due to current mismatch.

In an alternative embodiment, four separate series may be formed in parallel. For example, the first series may be formed by connecting the LC modules 570 in series to each other, the second series may be formed by the LC modules 571, and similarly with the LC modules 572 and 573. In this way, each separate series would have a substantially constant current output.

However, the above examples are only exemplary and are not intended to be limiting. For instance, if there is no or minimal difference between the operating temperature for LC module 570 and LC module 571 in the arrays 560-565 and the LC modules are manufactured to have common operating characteristics (e.g., operating current output), the LC modules 570 and 571 of each array may be electrically coupled in series.

Figure 9:
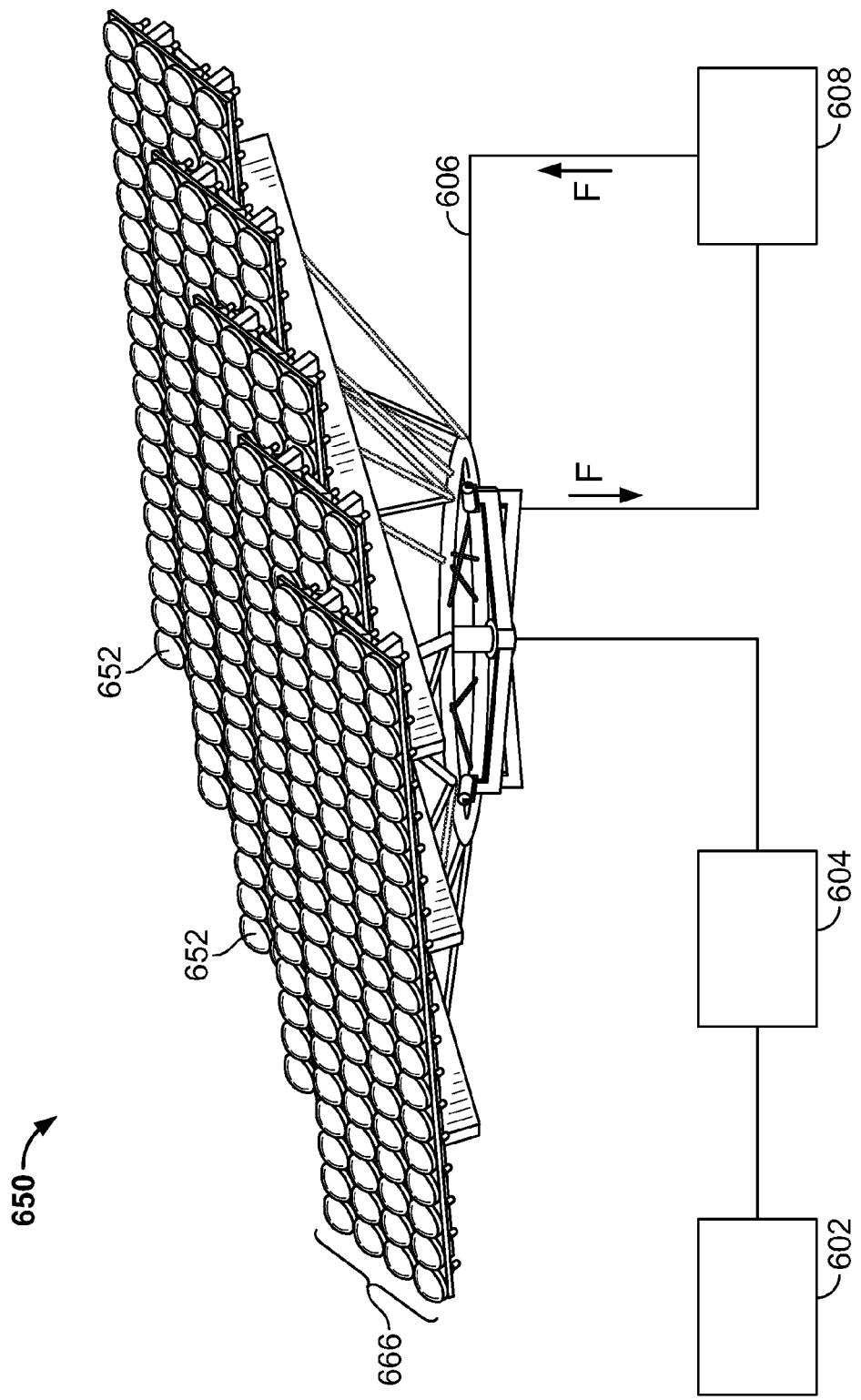
FIG. 9 is a perspective view of an LEC system formed in accordance with one embodiment that is mounted to a tracking structure.
Figure 10:
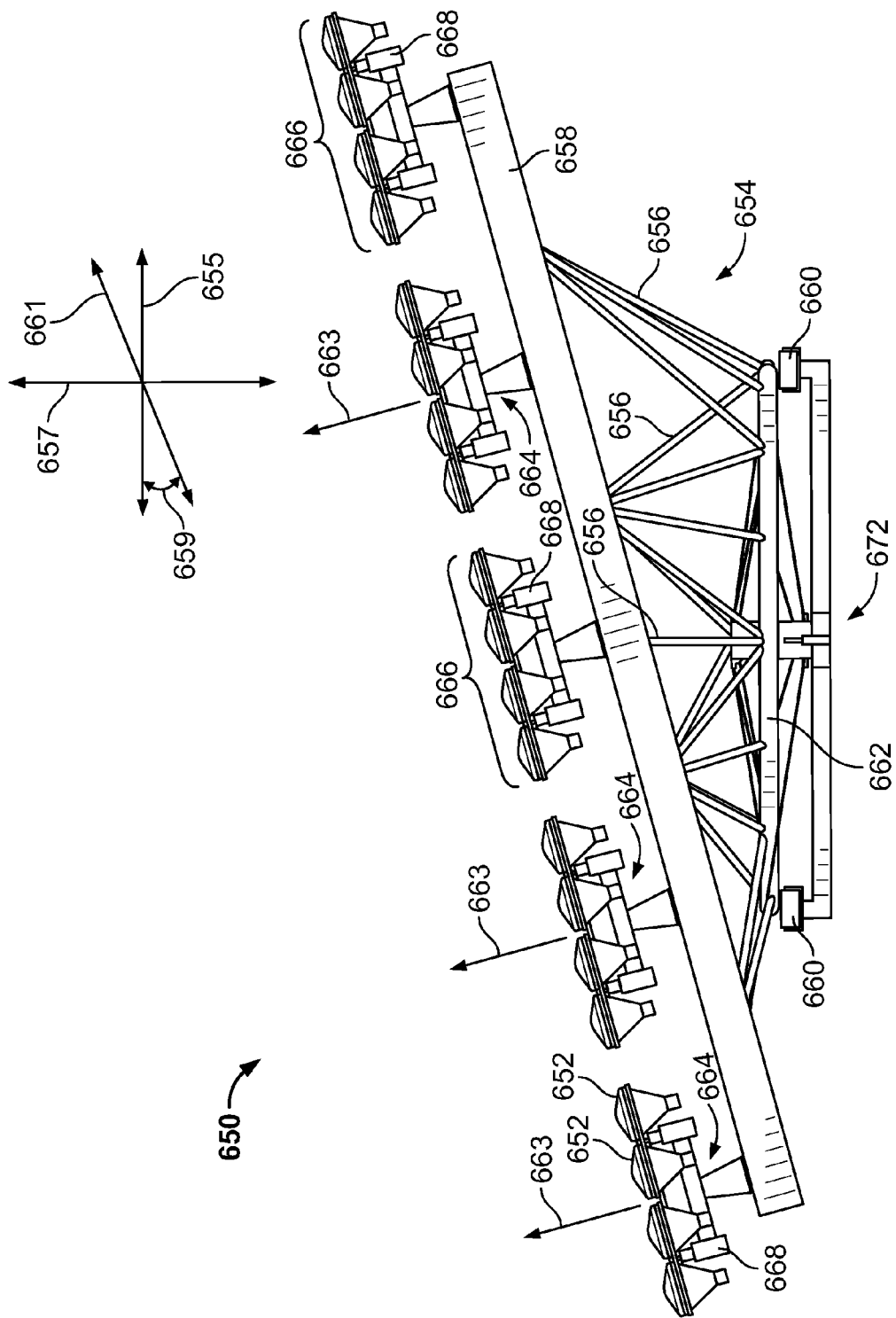
FIG. 10 is a side view of the LEC system shown in FIG. 9 mounted on the tracking structure.

FIGS. 9 and 10 are a perspective view and a side view, respectively, of a LEC system 650 that may be formed in accordance to one embodiment. The LEC system 650 has a plurality of LC modules 652 that are connected to a fluid circuit 606. The LEC system 650 also includes a source locator 602 that determines the location of the light source relative to the LEC system 650. For example, the source locator 602 may include a sensor that detects energy from the light source and/or the source locator 602 may use embedded astronomical tables that contain coordinates of the expected location of the light source based on the physical location of the source locator 602 and the date and time of the year. The source locator 602 is communicatively coupled to a motion control tracking unit 604 and sends information relating to the light source location to the tracking unit 604. The tracking unit 604 is communicatively coupled to one or more servo motors. The tracking unit 604 can store information relating to the incident direction 663 (FIG. 10) for the LC modules 652. When the tracking unit 604 receives location information from the source locator 602 the tracking unit 604 determines if the incident direction 663 for the LC modules 652 is directed toward the light source. If the incident direction 663 is not directed toward the light source, the tracking unit 604 instructs the servo motors to tilt and/or rotate, respectively the groups 666 of LC modules 652 so that the incident direction 663 is directed toward the light source.

The LEC system 650 also includes a fluid conversion system 608 coupled in flows communication to the fluid circuit 606. The direction of flows of the working fluid F is indicated by arrows throughout the fluid circuit 606. In one embodiment, the fluid conversion system 608 receives the heated working fluid F and converts the absorbed thermal energy into electrical energy N. Although not shown, the fluid conversion system 608 may include a pump, valves, tanks, and/or other fluid devices that facilitate regulating the flow of the working fluid F. Alternatively, the fluid conversion system 608 may store the heated working fluid F and/or direct the flow of the working fluid F to other locations where, for example, the working fluid F may be used for heating.

As shown in FIG. 10, the LC modules 652 may be arranged in groups 666 of rows and are mounted onto a mounting or tracking structure 654. The tracking structure 654 may be capable of manipulating the orientation of the LC modules 652 (e.g., by tilting and/or rotating the LC modules 652) so that the LC modules 652 are substantially aligned with a light source (not shown). The tracking structure 654 includes an inclined platform grid 658 for holding the LC modules 652, a circular guide 662, and a plurality of support bars 656 that extend from the circular guide 662 to the inclined platform grid 658. The tracking structure 654 may be fabricated from any sturdy material, such as plastic or a hollow metal alloy tube, such as extruded aluminum, or solid bar. The tracking structure 654 may also include wheels 660 attached to the circular guide 662. The circular guide 662 may be coupled to a servo motor 672 for rotating the circular guide 662 and the tracking structure 654 along an axis parallel with respect to a vertical axis 657. As shown in FIG. 10, the groups 666 of rows of the LC modules 652 may rest upon rotatable supports 668 which are held by stands 664. Another servo motor (not shown) may be connected to the rotatable supports 668 in a manner to rotate the LC modules 652 along the plane formed by the vertical axis 657 and a horizontal axis 655.

The tracking structure 654 may vary in structure and configuration based in part on an environment in which the tracking structure 654 operates. As shown in FIG. 10, the tracking structure 654 maintains the platform grid 658 at a desired inclined acute angle 659 with respect to horizontal and vertical axes 655 and 657. The acute angle 659 is measured between the horizontal axis and an inclined plane (denoted by arrow 661) that extends along the surface of the platform grid 658. The LC modules 652 are also distributed (e.g., in groups of rows) along the inclined plane. As shown in FIG. 10, the LC modules 652 are oriented to face in an incident direction 663 that projects at an angle with respect to the platform grid 658.

The LC modules 652 may be electrically and/or fluidicly coupled to each other or arranged with respect to each other as described above with reference to the LEC system 100 (FIG. 1) the LEC system 350 (FIG. 5), the arrays 401-403 (FIG. 6), the LEC system 500 (FIG. 7), and the LEC system 550 (FIG. 8). Furthermore, several of the LEC systems discussed above may be part of a larger master control system that controls and operates each LEC system.

A method of manufacturing a light conversion system for generating electrical and thermal energy is also provided. The method includes coupling a first LC module to a fluid circuit. The first LC module includes a light concentrating optical element that is configured to direct light energy toward a focal region and a receiver held at the focal region. The receiver includes a housing having a chamber that holds an energy conversion member. The energy conversion member transforms light energy received from the optical element into electrical and thermal energy. The method also includes coupling a second LC module to the fluid circuit in series with the first LC module. The fluid circuit has a working fluid flowing therethrough such that the working fluid absorbs thermal energy while flowing through the first and second LC modules. An amount of thermal energy in the working fluid increases as the working fluid flows through the second LC module.

In another embodiment, a method of manufacturing an LEC system for generating electrical and thermal energy is provided. The method includes providing a plurality of LC modules that are configured to convert light energy into electrical energy and to transform the light energy into thermal energy. Each LC module includes at least one photovoltaic (PV) cell that has a predetermined nominal current output. The method also includes coupling the LC module to an electrical circuit and coupling the LC modules along a fluid circuit such that a working fluid flowing through the fluid circuit absorbs thermal energy in the LC modules. The LC modules are positioned along the fluid circuit and/or electrically connected in such a way that the operating current output from the LC modules is substantially the same.

Thus, embodiments described herein provide the technical effect of an LEC system or method that generates at least one of electrical energy and thermal energy. In some embodiments, another technical effect of the LEC systems and methods described herein is that the temperature of the working fluid F may be boosted by an LC module that is configured to transform the light energy into substantially thermal energy. In some embodiments, another technical effect of the LEC systems and methods described herein is that the LEC system may be reconfigured by changing the connections and flow of the working fluid between LC modules and by substituting one type of LC module with another. In some embodiments, another technical effect of the systems and methods described herein is the more efficient use of light energy because the light energy is converted into both electrical and thermal energy.

In addition, many modifications may be made to adapt a particular situation or material to the teachings of the invention without departing from its scope. For example, the LEC systems discussed herein may be reconfigured during different seasons in order to maintain an efficient and durable operation of the respective system. Also, although different features were discussed in detail above with reference to certain embodiments or components, those skilled in the art understand that these features may be combined with other features or added to other components.

Also, dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising," and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §212, sixth paragraph, unless and until such claim limitations expressly use the phrase "means for" followed by a statement of function void of further structure.

What is claimed is:

1. A light energy conversion (LEC) system for generating electrical and thermal energy, the system comprising:
 a fluid circuit including upstream and downstream fluidic ports, the fluid circuit configured to allow a working fluid to flow therethrough;
 a plurality of point-focus primary optical elements configured to concentrate light energy toward corresponding point-focal regions; and
 a plurality of receiver units for converting the concentrated light energy into electrical and thermal energy, wherein the plurality of receiver units include first and second receiver units fluidicly coupled in series along the fluid circuit such that the working fluid progressively absorbs thermal energy while flowing through the first and second receiver units, an amount of thermal energy in the working fluid exiting the second receiver unit being greater than an amount of thermal energy in the working fluid exiting the first receiver unit;
 wherein the first receiver unit includes an energy conversion member and a secondary optical element having a fixed position with respect to the energy conversion member, the first receiver unit also including inlet and outlet fluidic ports, the inlet and upstream fluidic ports forming a sealed engagement through an interference fit and the outlet and downstream fluidic ports forming a sealed engagement through an interference fit, wherein the first receiver unit is removably coupled to the fluid circuit, the first receiver unit receiving light energy from one of the primary optical elements and being movable with respect to said primary optical element when the first receiver unit is removed from the fluid circuit; wherein the fluid circuit includes a unit holder having a body with an open end, the inlet and outlet fluidic ports of the first receiver unit forming respective interference fits with the upstream and downstream fluidic ports when the first receiver unit is advanced in an axial direction into the open end of the body and plugged into the unit holder.

2. The LEC system in accordance with claim 1 wherein the sealed engagements are readily separable to remove the first receiver unit from the fluid circuit.

3. The LEC system in accordance with claim 1 wherein the first receiver unit is located proximate to or at the point-focal region of one of the primary optical elements, the first receiver unit being separate from said one of the primary optical elements.

4. The LEC system in accordance with claim 1 further comprising an array of light concentrator (LC) modules that includes the plurality of receiver units and the plurality of primary optical elements, the array of LC modules being supported by a rotatable support, the first and second receiver units being separately removably coupled to the fluid circuit such that the first and second receiver units are capable of being removed one at a time.

5. The LEC system in accordance with claim 1 wherein the secondary optical element receives the concentrated light energy and directs the concentrated light energy toward the energy conversion member.

6. The LEC system in accordance with claim 1 wherein the secondary optical element receives some or all of the concentrated light energy and directs the concentrated light energy toward the energy conversion member.

7. The LEC system in accordance with claim 1, wherein the energy conversion members of the first and second receiver units include respective photovoltaic cells, the cells of the first and second receiver units having different nominal current outputs at standard test conditions.

8. The LEC system in accordance with claim 1, wherein the first receiver unit has a higher nominal current output than the second receiver unit, the first receiver unit being located upstream from the second receiver unit.

9. The LEC system in accordance with claim 1 wherein the energy conversion member of the first receiver unit includes a photovoltaic (PV) cell for generating electrical energy.

10. The LEC system in accordance with claim 9 wherein the working fluid absorbs thermal energy generated around the PV cell.

11. The LEC system in accordance with claim 1 wherein the first receiver unit is a first type of receiver unit and the second receiver unit is a different second type of receiver unit, the second receiver unit converting the light energy into only thermal energy.

12. The LEC system in accordance with claim 1 wherein the first receiver unit is a first type of receiver unit and the second receiver unit is a second type of receiver unit, the first and second types of receiver units being different such that the first and second types of receiver units have different energy outputs at standard test conditions.

13. The LEC system in accordance with claim 12 wherein the first receiver unit increases the thermal energy in the working fluid by a first amount of thermal energy and the second receiver unit increases the thermal energy in the working fluid by a second amount of thermal energy, wherein the second amount of thermal energy is greater than the first amount.

14. The LEC system in accordance with claim 1 wherein the primary optical elements and the first and second receiver units are coupled to a mounting structure for aligning with a light source.

15. The LEC system in accordance with claim 1 wherein the second receiver unit is removably coupled to the LEC system, the first and second receiver units being separate receiver units such that the first and second receiver units are capable of being removed one at a time.

16. The LEC system in accordance with claim 1 wherein an entirety of the working fluid exiting the first receiver unit flows through the second receiver unit.

17. The LEC system in accordance with claim 1 wherein the first and second receiver units are of a common type such that the first and second receiver units are structurally similar and have a substantially common energy output.

18. A method of manufacturing a light energy conversion (LEC) system for generating electrical and thermal energy, the method comprising:
providing a plurality of point-focus primary optical elements that are configured to concentrate light energy toward corresponding point-focal regions;
coupling a first receiver unit to a fluid circuit having upstream and downstream fluidic ports, the first receiver unit including an energy conversion member and a secondary optical element having a fixed position with respect to the energy conversion member, the first receiver unit also including inlet and outlet fluidic ports, the inlet and upstream fluidic ports forming a sealed engagement through an interference fit and the outlet and downstream fluidic ports forming a sealed engagement through an interference fit, the energy conversion member configured to transform the light energy into electrical and thermal energy, wherein the first receiver unit is removably coupled to the fluid circuit, the first receiver unit receiving light energy from one of the primary optical elements and being movable with respect to said primary optical element when the first receiver unit is removed from the fluid circuit; wherein the fluid circuit includes a unit holder having a body with an open end, the inlet and outlet fluidic ports of the first receiver unit forming respective interference fits with the upstream and downstream fluidic ports when the first receiver unit is advanced in an axial direction into the open end of the body and plugged into the unit holder;
coupling a second receiver unit to the fluid circuit in series with the first receiver unit, wherein the working fluid is configured to progressively absorb thermal energy while flowing through the first and second receiver units, an amount of thermal energy in the working fluid exiting the second receiver unit being greater than an amount of thermal energy in the working fluid exiting the first receiver unit.

19. The method in accordance with claim 18 further comprising replacing one of the first or second receiver units with a different type of receiver unit, the different type of receiver unit manufactured having a different energy output than the replaced receiver unit.

20. The method in accordance with claim 18 wherein the first receiver unit increases the thermal energy in the working fluid by a first amount of thermal energy and the second receiver unit increases the thermal energy in the working fluid by a second amount of thermal energy, wherein the second amount of thermal energy is greater than the first amount.

21. The method in accordance with claim 18 wherein the second receiver unit is removably coupled to the fluid circuit, the first and second receiver units being separate receiver units such that the first and second receiver units are capable of being removed one at a time.

22. The method in accordance with claim 18 wherein the first receiver unit is a first type of receiver unit and the second receiver unit is a second type of receiver unit, the first and second types of receiver units being different such that the first and second types of receiver units have different energy outputs at standard test conditions.

23. The method in accordance with claim 22 wherein the second receiver unit contains an energy conversion member that converts the light energy into only thermal energy.

24. The method in accordance with claim 18 wherein the energy conversion member of the first receiver unit includes a photovoltaic (PV) cell for generating electrical energy.

25. The method in accordance with claim 18 wherein coupling the first and second receiver units includes coupling the first and second receiver units to a mounting structure configured to align the first and second receiver units with a light source.

26. The method in accordance with claim 18 wherein an entirety of the working fluid exiting the first receiver unit flows through the second receiver unit.

27. The method in accordance with claim 18 wherein the first and second receiver units are of a common type such that the first and second receiver units are structurally similar and have a substantially common energy output.

* * * * *